United States Patent [19]

Mills et al.

[11] Patent Number: 5,661,640

[45] Date of Patent: Aug. 26, 1997

[54] COMPUTER CHASSIS HAVING A SIZE-ADJUSTABLE, TEM-SHIELDED CIRCUIT BOARD SUPPORT PLATE STRUCTURE THEREIN

[75] Inventors: Richard Steven Mills, Austin; Randall Terry Smith, Georgetown, both of Tex.

[73] Assignee: Dell USA, L.P., Austin, Tex.

[21] Appl. No.: 584,862

[22] Filed: Jan. 5, 1996

[51] Int. Cl.$^6$ ..................................................... H05K 7/14
[52] U.S. Cl. ........................ 361/801; 361/800; 361/802; 361/803; 361/818; 174/35 MS
[58] Field of Search ..................................... 361/683, 726, 361/727, 736, 740, 748, 752, 759, 788, 796, 800, 801, 802, 816, 818, 756; 174/35 GC, 35 MS, 35 TS, 50, 52.1, 51

[56] References Cited

U.S. PATENT DOCUMENTS 5,457,608  10/1995  Scholder et al. ..................... 361/759
5,490,038  2/1996  Scholder et al. ..................... 361/759

*Primary Examiner*—Leo P. Picard
*Assistant Examiner*—Anthony Dinkins
*Attorney, Agent, or Firm*—Konneker & Smith

[57] ABSTRACT

A computer chassis has a cotton side wall upon which a two-section support plate structure is mounted. Each of the two support plate sections has, along a side edge periphery thereof, an upturned TEM shielding lip portion. The plate sections are supportingly securable to the underside of a printed circuit board, such as the computer motherboard, and are slidably adjustable relative to the underlying bottom chassis side wall to selectively adjust the overall size of the support plate structure so that different sizes of printed circuit boards may be alternatively secured thereto while maintaining proper spacing between the TEM shielding lip portions and adjacent side edge portions of the supported circuit board.

20 Claims, 3 Drawing Sheets

COMPUTER CHASSIS HAVING A SIZE-ADJUSTABLE, TEM-SHIELDED CIRCUIT BOARD SUPPORT PLATE STRUCTURE THEREIN

BACKGROUND OF THE INVENTION

The present invention generally relates to computer apparatus and, in a preferred embodiment thereof, more particularly relates to the TEM-shielded support of a circuit board, such as a system motherboard, on a computer chassis.

Printed circuit boards used in various types of computers are typically mounted on a rectangular sheet metal mounting plate that overlies a bottom side wall of a sheet metal chassis structure in turn disposed within a plastic outer housing. During operation of the circuit board electromagnetic interference (EMI) radiation is generated within the board, emanates therefrom, and must be substantially prevented from escaping outwardly through the housing structure. A primary source of EMI radiation generated by a circuit board during its operation is commonly referred to as transverse electromagnetic mode (TEM) radiation and is generated outwardly around the peripheral edge of the circuit board.

TEM radiation is created primarily by the alternating clock current transmitted through the circuit board traces, and the instantaneous current changes in the electronic board components such as chips, and is manifested as a generally wave-shaped mutual inductance disturbance between the spaced apart ground plane and power plane portions of the circuit board disposed within its dielectric substrate member. The TEM wave effect can account for up to about seventy five percent of the total EMI interference generated by the operating circuit board, and creates EMI radiation that is discharged from the edge periphery of the board substrate in a generally parabolic pattern.

In order to provide TEM radiation edge shielding for a circuit board disposed, as described above, on a metal mounting plate secured atop a bottom side wall of a sheet metal chassis it has been a conventional practice to mount the board so that two perpendicular side edges thereof are disposed in a spaced apart, facing relationship with two perpendicular vertical side walls of the chassis, with the other two side edges of the circuit board being in a spaced apart, facing relationship with a perpendicular pair of upturned shielding lip portions of the metal mounting plate. The two perpendicular chassis walls, together with the mounting plate lips, form a TEM radiation "fence" that acts as a barrier to undesirable passage of EMI radiation outwardly through the computer housing.

Under conventional chassis construction practice the rectangular metal circuit board mounting plate is of a one piece construction having a fixed length and a fixed width. Accordingly, as a practical matter, the mounting plate can accommodate only a single size of associated circuit board. For example, a circuit board having either a length or width greater than that of the mounting plate cannot be mounted thereon. Of course, a circuit board smaller than the one for which the mounting plate was designed could be mounted on the support plate. However, at least one TEM-generating edge of the mounted board would be positioned too far away from the TEM "fence" to effectively shield the TEM radiation emanating from that board side edge. Thus, only the designed-for circuit board size can be suitably handled by the fixed size mounting plate.

From a manufacturing standpoint this means that to incorporate a differently sized circuit board (such as a motherboard) in a given computer, the configuration of the board mounting plate, and thus the chassis upon which it is mounted, must be changed. The necessity of reconfiguring the chassis arises from the change in mounting geometry (such as mounting hole locations and the like) occasioned by the different form factor of the revised mounting plate. Having to reconfigure the chassis each time that the motherboard (or other printed circuit board) size needs to be changed, for example to upgrade the computer, represents a considerable manufacturing inefficiency with an attendant increase in the production cost of a given computer line.

Moreover, from the consumer's standpoint this conventional manufacturing limitation can markedly limit his future ability to "upgrade" his computer by replacing the original motherboard with a more powerful but differently sized one at a later date. The consumer must thus often choose between two imperfect options—tolerating a computer that, from a computing power/speed standpoint, is no longer "state of the art", or obtaining this performance increase at the cost of purchasing a complete new computer.

As can be seen from the foregoing, it would be desirable to provide improved TEM-shielding circuit board mounting plate apparatus that eliminates or at least substantially reduces the above-mentioned problems, limitations and disadvantages commonly associated with conventional fixed geometry mounting plate structures as generally described above. It is accordingly an object of the present invention to provide such improved mounting plate apparatus.

SUMMARY OF THE INVENTION

In carrying out principles of the present invention, in accordance with a preferred embodiment thereof, using a uniquely configured adjustable TEM-shielding mounting plate structure system motherboards (or other types of printed circuit boards) of differing sizes can be operatively mounted on the base wall of a computer chassis without altering the configuration of the chassis.

The computer chassis has a wall with an inner side, and the adjustable TEM-shielding circuit board mounting plate structure includes first and second separate base walls. The first base wall is secured to the inner side of the computer chassis wall in a parallel relationship therewith and is supportingly attachable to a first underside portion of a printed circuit board. The first base wall has a transverse first peripheral edge lip laterally projecting away from the computer chassis wall and having an end portion longitudinally projecting parallel to the computer chassis wall and outwardly beyond the balance of the first base wall.

The second base wall is secured to the inner side of the computer chassis wall in a parallel relationship therewith for movement relative thereto in a direction parallel to the length of the first peripheral edge lip between first and second positions. The second base wall has a transverse second peripheral edge lip laterally projecting away from the computer chassis wall and having an end portion longitudinally extending transversely to the end portion of the first peripheral edge lip and outwardly beyond the balance of the second base wall. The end portions of the first and second peripheral edge lips are transversely and releasably interconnectable with one another with the second base wall in each of its aforementioned first and second positions.

Preferably, the first base wall is also adjustable relative to the underlying chassis wall in a direction transverse to the adjustment direction of the second base wall so that both the horizontal length and width of the overall mounting plate structure may be adjusted to accommodate similar length and width variations in the printed circuit board to be operatively mounted on the top side of the mounting plate structure. The mounting plate structure is representatively mounted in a corner portion of the chassis in a manner such that a pair of contiguous upwardly projecting side walls of the chassis form with the transverse peripheral edge lip end portions of the first and second base walls a TEM-shielding "fence" structure that the side edges of the installed circuit board face and are inwardly spaced apart from by a predetermined distance.

In a preferred embodiment of the adjustable TEM-shielding mounting plate structure the first and second base walls have upwardly projecting elongated embossments formed thereon, with the length of the embossment on the first base wall extending perpendicularly to the length of the first peripheral edge lip, and the length of the embossment on the second base wall extending perpendicularly to the length of the second peripheral edge lip. The base wall embossments are slidingly nested over similar upwardly projecting embossments formed on the underlying computer chassis wall and are captively retained thereon by depending tabs formed on the base wall embossments and captively retained in longitudinally extending slots formed in the underlying chassis wall embossments for movement along their lengths.

The base wall embossments, and thus their associated first and second base walls, may be releasably locked in selectively variable adjusted positions by aligning a hole in each of the base wall embossments with a selected one of a series of holes formed in its underlying chassis wall embossment and than threading a locking screw downwardly into each horizontally aligned hole pair.d To prevent the creation of a TEM-shielding gap at the peripheral edge lip corner portion of the mounting plate structure in response to a length and/or width adjustment of the mounting plate structure, the end portions of the first and second peripheral edge lips are transversely and releasably interlocked in a transversely crossed relationship by means of a first longitudinally spaced series of transverse slots formed in a side edge of the first peripheral edge lip end portion and a second longitudinally spaced series of transverse slots formed in an oppositely facing side edge of the second peripheral edge lip end portion. The two lip end portions are releasably interlocked, at aligned slots thereon, by placing sections of each end portion in the facing side edge slot of the other end portion.

DETAILED DESCRIPTION

Figure 1:
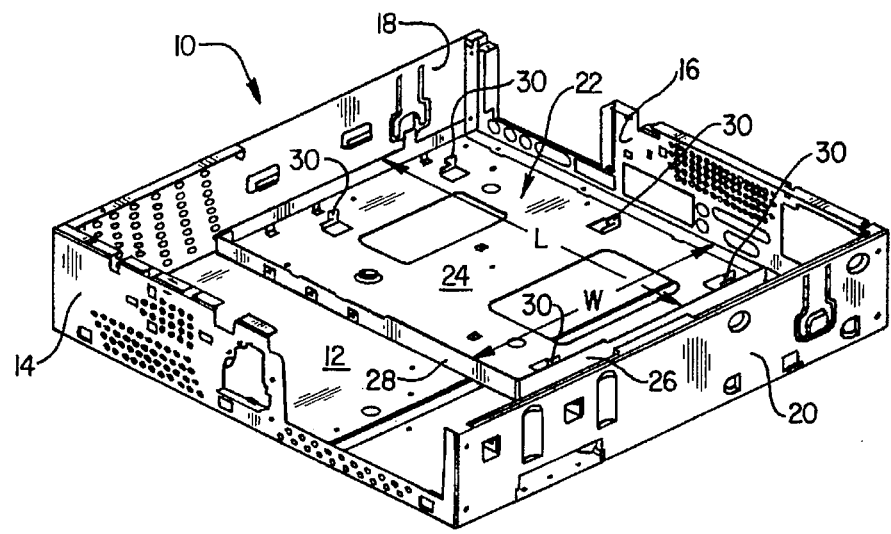
FIG. 1 (Prior Art) is a perspective view of a representative computer chassis having installed on a bottom side wall thereof a conventional fixed geometry TEM-shielded support plate for a system planar or motherboard.

Perspectively illustrated in FIG. 1 (Prior Art) is a conventional sheet metal computer chassis 10 having a rectangular base wall 12, an open top side, opposite upstanding front and rear side walls 14, 16 and opposite upstanding left and right side walls 18, 20. Secured to the top side of the base wall 12, in a parallel relationship therewith, is an sheet metal circuit board mounting plate 22 having an elongated rectangular base wall 24 disposed generally in a left rear corner portion of the chassis base wall 12. The mounting plate 22 has an upstanding end wall 26 at the right end of its base wall 24, an upstanding side wall 28 at the front side of its base wall 24, a fixed horizontal length L, and a fixed horizontal width W.

Mounting plate 22 is configured to support, on the top side thereof, a rectangularly configured printed circuit board (not shown), such as the computer's system motherboard, having a length and width somewhat shorter than the length and width L and W, respectively, of the mounting plate base wall 24. Upwardly projecting mounting hooks 30 are formed on the base wall and are removably receivable in similarly spaced openings in the motherboard to releasably secure the motherboard to the top side of the mounting plate 22.

When the motherboard is operatively secured to the top side of the mounting plate 22 in this manner, the front side and right side edges, respectively, of the motherboard are inwardly spaced at predetermined horizontal distances from the upwardly projecting mounting plate walls 28 and 26, with the walls 28 and 26 functioning as TEM shields or "fences" with respect to EMI radiation generated from these side edge portions of the circuit board during its operation. In a similar manner the left and rear side edges, respectively, of the mounted circuit board are inwardly spaced at predetermined horizontal distances inwardly from the chassis side walls 18 and 16 which also serve as TEM shields of "fences" with respect to EMI radiation generated from these side edge portions of the circuit board during its operation.

While a system motherboard having a slightly different length and/or width could be potentially mounted atop the fixed geometry mounting plate 22, as a practical matter the mounting plate 22, and thus the overall chassis 10 can accommodate a motherboard of only a single size. Increasing the size of the motherboard even slightly can place its side edges too close to the vertical TEM shield structure defined by the chassis and mounting plate walls 16, 18, 26, 28 or prevent the motherboard from fitting in the confines of such walls, while decreasing the size of the motherboard can place its side edges too far inwardly of the vertically projecting TEM shield structure for it to be effective as a TEM barrier. Accordingly, to accommodate a motherboard of a different length and/or width both the chassis 10 and the fixed geometry mounting plate 22 have to be reconfigured.

Figure 3:
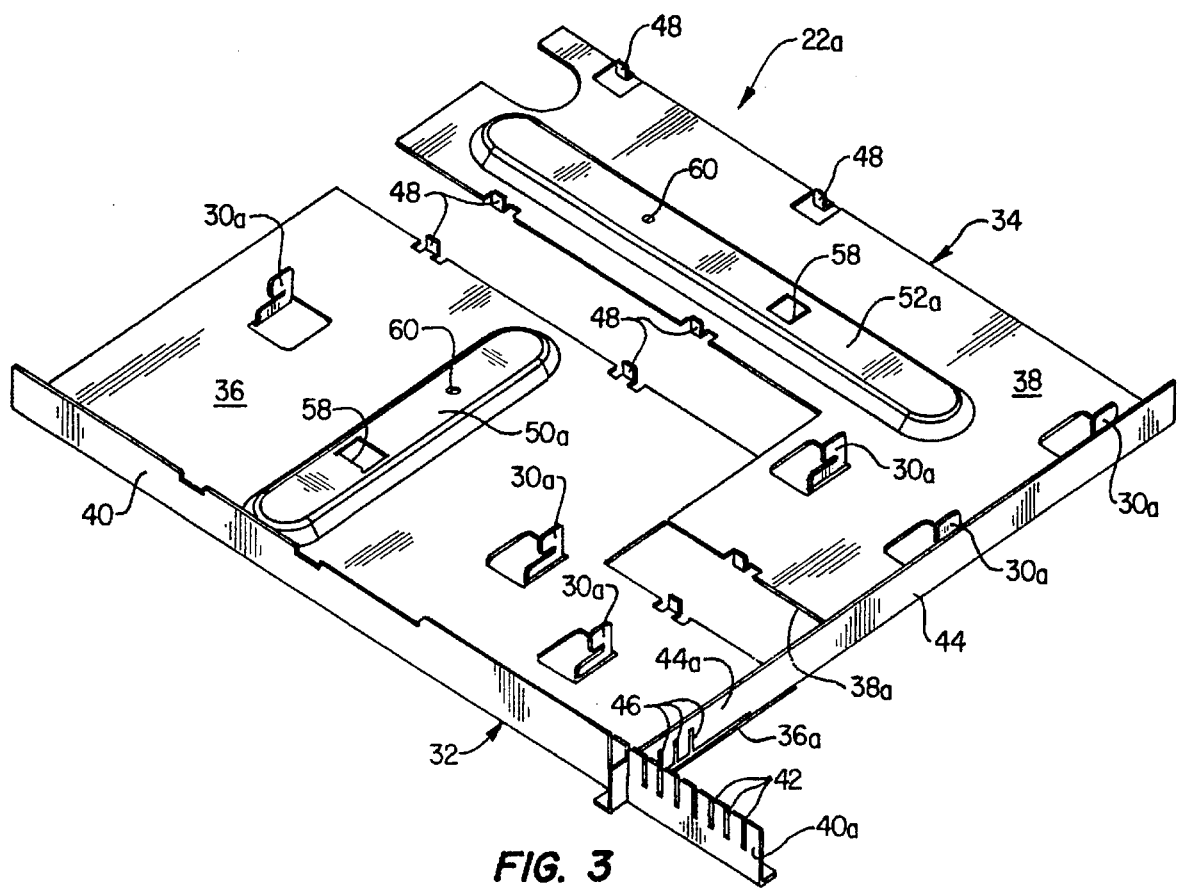
FIG. 3 is an enlarged scale perspective view of the improved support plate structure removed from its associated computer chassis and representatively lengthened in a front-to-rear direction only.
Figure 2A:
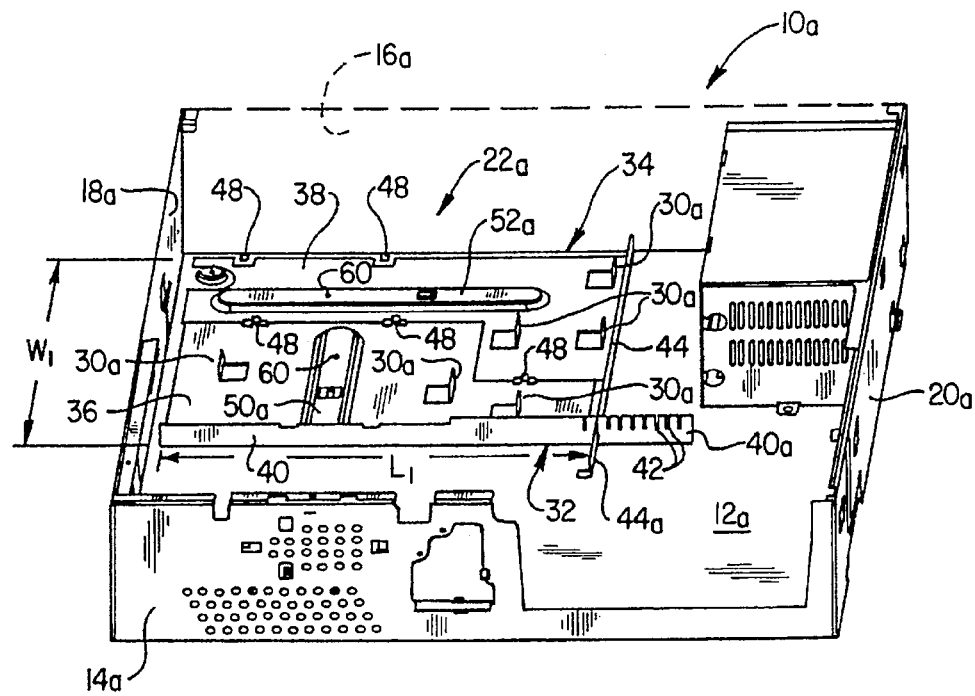
FIGS. 2A and 2B are perspective views of a representative computer chassis having installed on a bottom side wall thereof an improved, TEM-shielded, size-adjustable circuit board support plate structure embodying principles of the present invention, the support plate structure being shown in its minimum adjusted size configuration in FIG. 2A, and in its maximum adjusted size configuration in FIG. 2B.
Figure 2B:
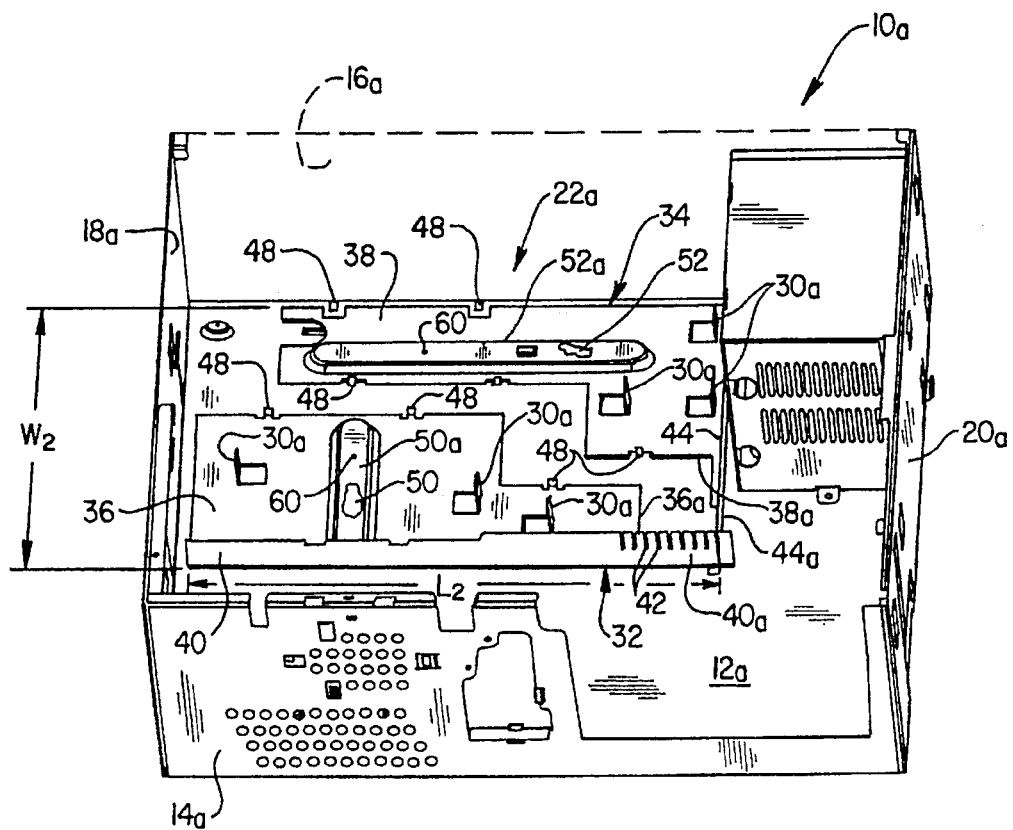

Referring now to FIGS. 2A, 2B and 3, the present invention provides an improved computer chassis structure 10a that uniquely incorporates therein a specially designed adjustable mounting plate structure 22a which, as will now be described, permits the same chassis 10a to accommodate motherboards (or other printed circuit boards) of different sizes without reconfiguring the chassis or replacing the motherboard mounting plate structure 22a.

Chassis 10a is formed from sheet metal, is similar in basic configuration to the previously described chassis 10, and has a horizontal base wall 12a, an upturned front side wall 14a, an upturned rear side wall 16a (shown in phantom for illustrative clarity), and upturned left and right side walls 18a and 20a. The mounting plate structure 22a is also formed from sheet metal and comprises two separate mounting plate sections 32, 34 respectively having generally L-shaped base wall portions 36 and 38. Mounting plate section 32 is disposed generally forwardly of mounting plate section 34, and base wall portions 36 and 38 are elongated in left-to-right directions, as viewed in FIGS. 2A and 2B. Bent upwardly from the top sides of the base wall portions 36 and 38 are spaced series of mounting hooks 30a that, like the previously described mounting hooks 30 (see FIG. 1), are upwardly receivable in corresponding openings in a system motherboard (or other type of printed circuit board) to removably secure it atop the mounting plate structure 22a.

Extending along the front side of the front base wall portion 36 is an upturned front side wall 40 having a right end section 40a that extends rightwardly beyond the right end 36a of the front base wall portion 36 and has a spaced series of transverse slots 42 extending downwardly through its top side edge. In a similar manner, an upturned right side wall 44 is formed along the right side edge of the rear base wall portion 38 and has a front end portion 44a extending forwardly beyond the front side edge 38a of the rear base wall portion 38. For purposes later described herein, a spaced series of transverse slots 46 (see FIG. 3) extend upwardly through the bottom side edge of the front end portion 44a of the upturned right side wall 44. Formed on the indicated peripheral edge locations of the front and rear base wall portions 36, 38 are upturned tabs 48 that serve to underlie and provide additional support points for the motherboard or other type of printed circuit board operatively secured atop the mounting plate structure 22a.

In a manner subsequently described in detail herein, the front and rear mounting plate sections 32, 34 are secured to the top side of the chassis base wall 12a for sliding movement relative thereto between a first position (shown in FIG. 2A) in which the front and rear base wall portions 36, 38 are horizontally "nested" with one another to provide the two-piece mounting plate structure 22a with a horizontal length $L_1$ and a horizontal width $W_1$, and a second, horizontally expanded position shown in FIG. 2B. In such second position of the two-piece mounting plate structure 22a shown in FIG. 2B, the front mounting plate section 32 has been forwardly shifted away from its FIG. 2A position, the rear mounting plate section 34 has been rightwardly shifted away from its FIG. 2A position, the effective horizontal length of the mounting plate structure 22a has been increased from $L_1$ (FIG. 2A) to $L_2$ (FIG. 2B), and the effective horizontal width of the mounting plate structure 22a has been increased from $W_1$ (FIG. 2A) to $W_2$ (FIG. 2B).

Accordingly, with the adjustable mounting plate structure in its FIG. 2A minimum horizontal size orientation, a motherboard having a length and width somewhat smaller than the length and width $L_1$ and $W_1$ of the mounting plate structure 22a may be mounted atop the front and rear base wall portions 36, 38 of the structure 22a in a manner such that the four side edges of the mounted motherboard face and are spaced horizontally inwardly by predetermined distances from the TEM-shielding chassis and mounting structure walls 16a, 18a, 40, 44.

Additionally, using the same mounting plate structure 22a, and without modifying the chassis 10a in any manner, a motherboard having a substantially larger length and width may be alternatively secured atop the mounting plate structure 22a, in its expanded FIG. 2B orientation, while maintaining essentially the same horizontal gap between the side edges of the motherboard and the TEM-shielding chassis and mounting structure walls 16a, 18a, 40, 44. This unique feature of the present invention advantageously permits circuit board upgrading to be effected by the manufacturer or the consumer without a changeout of any computer structure other than the circuit board being replaced.

Figure 4:
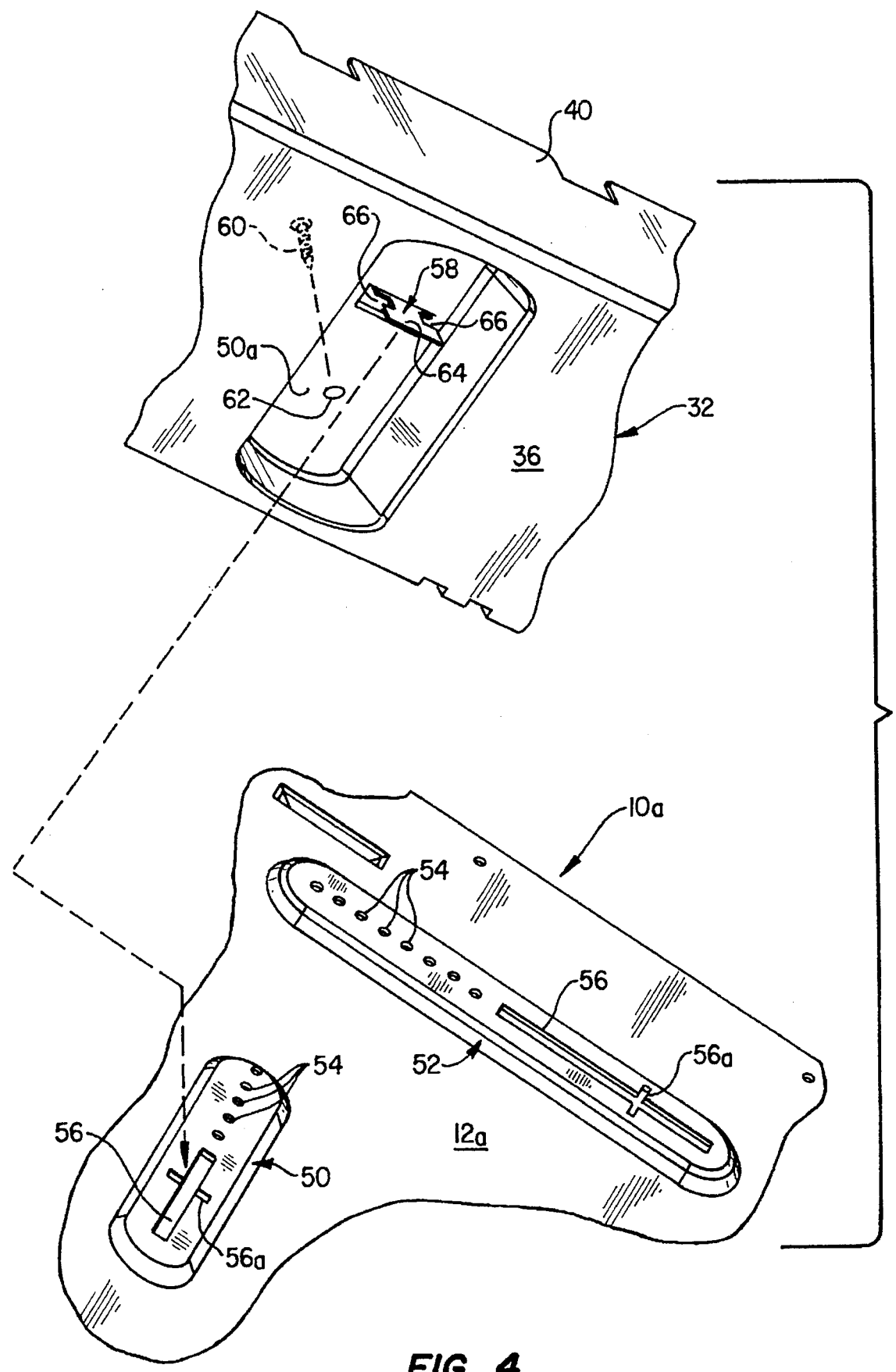
FIG. 4 is an enlarged scale perspective detail of portions of the improved support plate structure, and an underlying portion of the bottom chassis wall, and illustrates the manner in which a portion of the support plate structure is adjustably secured to the bottom chassis wall.

With reference to FIGS. 2A–4, the slidable mounting of the front and rear mounting plate sections 32 and 34 on the top side of the chassis base wall 12a will now be described. As best illustrated in FIG. 4, a pair of upwardly projecting, elongated front and rear embossments 50 and 52 are formed on the chassis base wall 12, with embossment 52 longitudinally extending parallel to the rear chassis side wall 16a and the embossment 50 being disposed forwardly of the embossment 52 and longitudinally extending transversely thereto. Each of the embossments 50, 52 has a longitudinally spaced series of circular holes 54 disposed on a top side of one end thereof, and an elongated slot 56 longitudinally extending along a top side of the opposite end and having a transversely enlarged longitudinally intermediate portion 56a.

Similar upwardly projecting embossments 50a, 52a are formed on the front and rear base wall portions 36, 38 of the mounting pate sections 32, 34 and are configured to overlie and slidingly receive the chassis base wall embossments 50 and 52, respectively. Embossment 50a is substantially longer than its underlying embossment 50, and embossment 52a is substantially longer than its underlying embossment 52.

With primary reference now to FIG. 4, sliding adjustment of the upper embossment 50a relative to its underlying embossment 50, and subsequent releasable anchoring of the upper embossment 50a to its underlying embossment 50, is effected by means of a downwardly bent tab portion 58 formed on the upper side wall of embossment 50a, a self-tapping metal screw 60, and a small circular hole 62 formed in the top side wall of the upper embossment 50a. The tab 58 has a generally rectangular configuration, with a lower end portion 64 and an opposed pair of side edge notches 66 located just above the lower end portion 64.

To operatively attach the mounting plate section 36 to the chassis base wall 12a is a selected adjusted position thereon, the upper embossment 50a is placed downwardly over the lower embossment 50 in a manner causing the upper embossment tab 64 to downwardly enter the transversely enlarged slot portion 56a in the lower embossment 50. The mounting plate section 36 is then moved longitudinally relative to the lower embossment 50 in a manner causing the lower tab portion 64 to be captively retained within the lower embossment 50 (with opposite side edges of its top side wall along the length of the slot 56 being received in the tab notches 66) and the upper embossment hole 62 being brought into overlying registry with a selected one of the holes 54 in the top side of the lower embossment 50. The screw 60 is then inserted downwardly through the upper embossment hole 62 and threaded into the selected hole 54 in the lower embossment 50.

The other mounting plate section 34 is slidably and adjustably secured to the chassis base wall 12a in the same manner using the nested embossments 52 and 52a. This permits the front mounting plate section 32 to be slidably adjusted in a front-to-rear direction relative to the chassis base wall 12a, and permits the rear mounting plate section 34 to be slidably adjusted in a left-to-right direction relative to the chassis base wall 12a.

When each of the front and rear mounting plate section is adjusted in transverse directions in this manner to accommodate supported circuit boards of differing lengths and widths, the outwardly projecting end portions 40a and 44a of the TEM-shielding walls or lips 40 and 44 are releasably joined by interlocking a contiguous pair of the transverse wall slots 42 and 46 as best illustrated in FIG. 3. The outward extension of the TEM-shielding walls 40 and 44 past the balances of their associated mounting plate sections, together with their interlockability, prevents the creation of an undesirable TEM-shielding wall gap at the front right corner of the mounting plate structure 22a when it is outwardly adjusted from its FIG. 2A minimum size orientation.

While the two-piece mounting plate structure 22a just described is adjustable in two directions, to accommodate changes in the width and length of a replacement circuit board to be secured atop the mounting plate structure, it will readily be appreciated that the mounting plate structure can also be adjusted in only a single direction if desired. For example, as illustrated in FIG. 3, the mounting plate structure 22a may be adjusted in only a front-to-rear widthwise direction simply by outwardly moving only the front mounting plate section 32 forwardly away from its FIG. 2A minimum mounting plate structure size orientation.

The foregoing detailed description is to be clearly understood as being given by way of illustration and example only, the spirit and scope of the present invention being limited solely by the appended claims.

What is claimed is:

1. Computer apparatus comprising:
    a computer chassis having a wall with an inner side; and
    an adjustable, transverse electromagnetic mode-shielding circuit board mounting plate structure including:
        a first base wall secured to said inner side of said computer chassis wall in a parallel relationship therewith and being supportingly attachable to a first underside portion of a printed circuit board, said first base wall having a transverse first peripheral edge lip laterally projecting away from said computer chassis wall and having an end portion longitudinally projecting parallel to said computer chassis wall and outwardly beyond the balance of said first base wall, and
        a second base wall secured to said inner side of said computer chassis wall in a parallel relationship therewith for movement relative thereto in a direction parallel to the length of said first peripheral edge lip between first and second positions, said second base wall having a transverse second peripheral edge lip laterally projecting away from said computer chassis wall and having an end portion longitudinally extending transversely to said end portion of said first peripheral edge lip and outwardly beyond the balance of said second base wall, said end portions of said first and second peripheral edge lips being transversely and releasably interconnectable with one another with said second base wall in each of said first and second positions thereof.

2. The computer apparatus of claim 1 wherein:
    said second base wall is slidably supported on said inner side of said computer chassis wall for movement relative thereto between said first and second positions, and
    said computer apparatus further comprises cooperating portions formed on said computer chassis wall and said second base wall and operative to captively retain said second base wall on said inner side of said computer chassis wall.

3. The computer apparatus of claim 2 wherein said cooperating portions include:
    an elongated slot formed on one of said second base wall and said computer chassis wall, and a tab formed in the other of said second base wall and said computer base wall and captively received in said slot for movement along its length.

4. The computer apparatus of claim 3 wherein:
    said cooperating portions are raised, slidably nested embossment portions of said computer chassis wall and said second base wall.

5. The computer apparatus of claim 4 wherein:
    said tab is formed on said embossment portion of said second base wall, and
    said slot is formed on said embossment portion of said computer chassis wall.

6. The computer apparatus of claim 4 further comprising:
    a series of holes formed in said embossment portion of said computer chassis wall and mutually spaced apart in a direction parallel to said first peripheral edge lip, and
    a hole formed in said embossment portion of said second base wall and being alignable with a selected one of said series of holes formed in said embossment portion of said computer chassis wall to permit a locking screw to be passed through said second base wall embossment portion hole and threaded into said selected one of said series of holes to thereby releasably lock said embossment portions of said computer chassis wall and said second base wall together.

7. The computer apparatus of claim 1 wherein:
    said first and second base walls have spaced apart, transversely projecting hook portions formed thereon and configured to be lockingly received in corresponding openings formed in the printed circuit board.

8. The computer apparatus of claim 7 wherein:
    said first and second base walls further having spaced apart, transversely projecting tab portion formed thereon and configured to underlie and supportingly engage corresponding underside portions of the printed circuit board.

9. The computer apparatus of claim 1 wherein:
    said computer chassis and said first and second base walls are of a sheet metal construction.

10. The computer apparatus of claim 1 wherein:
    said computer chassis is of a generally rectangular configuration and has a corner portion on which a pair of transverse contiguous side walls of said chassis project upwardly from said inner side of said computer chassis wall, and
    said first and second base walls are disposed within said corner portion, with said first and second peripheral edge lips forming with said transverse contiguous side walls a generally rectangular transverse electromagnetic mode-shielding barrier within which the printed circuit board may be operatively disposed.

11. The computer apparatus of claim 1 wherein:
    said end portion of said first peripheral edge lip has a longitudinally spaced series of transverse slots formed therein and extending inwardly through a side edge thereof, and
    said end portion of said second peripheral edge lip has a transverse slot formed therein and extending inwardly through a side edge thereof facing in an opposite direction than said side edge of said end portion of said first peripheral edge lip,
    said end portions of said first and second peripheral edge lips being transversely and releasably interlocked with said transverse slot in said end portion of said second peripheral edge lip receiving a section of said end portion of said first peripheral edge lip, and one of said series of slots in said end portion of said first peripheral edge lip receiving a section of said end portion of said second peripheral edge lip.

12. Computer apparatus comprising:

a computer chassis having a bottom wall with an inner side; and an adjustable, transverse electromagnetic mode-shielding circuit board mounting plate structure including:

a first section having a first base wall attachable to a first underside portion of a printed circuit board, and a first peripheral edge lip laterally extending transversely to said first base wall and having an end portion longitudinally extending outwardly from the balance of said first base wall in a direction generally parallel thereto, a second section having a second base wall attachable to a second underside portion of the printed circuit board, and a second peripheral edge lip laterally extending transversely to said second base wall and having an end portion longitudinally extending outwardly from the balance of said second base wall in a direction generally parallel thereto, first mounting means for mounting said first base wall on said inner side of said bottom chassis wall, in a parallel relationship therewith, for sliding movement relative thereto in opposite directions transverse to the length of said first peripheral edge lip, and for releasably locking said first base wall to said bottom chassis wall in a selectively variable adjusted position thereon, second mounting means for mounting said second base wall on said inner side of said bottom chassis wall, in a parallel relationship therewith and with said second peripheral edge lip extending transversely across said first peripheral edge lip, for sliding movement relative to said bottom chassis wall in opposite directions transverse to the length of said first peripheral edge lip, and for releasably locking said first base wall to said bottom chassis wall in a selectively variable adjusted position thereon, and cooperating interlocking means on said first and second peripheral edge lips for releasably holding them together in a transversely crossed relationship.

13. The computer apparatus of claim 12 wherein:

said first mounting means include slidingly nested upwardly projecting lower and upper first embossments respectively formed on said chassis bottom wall and said first base wall and being elongated in a direction transverse to the length of said first peripheral edge lip, and said second mounting means include slidingly nested upwardly projecting lower and upper second embossments respectively formed on said chassis bottom wall and said second base wall and being elongated in a direction transverse to the length of said second peripheral edge lip.

14. The computer apparatus of claim 13 wherein:

said first and second mounting means further include tabs formed on said upper first and second embossments, and longitudinally extending slots formed on said lower first and second embossments, said tabs being captively retained in said slots for sliding movement along their lengths.

15. The computer apparatus of claim 13 wherein:

said first and second mounting means further include longitudinally spaced series of holes formed in said lower first and second embossments, and holes formed in said upper first and second embossments and alignable with selectively variable underlying holes in said series thereof to permit screws to be extended through and fastened into aligned hole pairs to thereby releasably lock said first and second sections in selectively variable adjusted positions along said chassis bottom wall.

16. The computer apparatus of claim 12 wherein said interlocking means include:

longitudinally spaced series of transverse slots formed in oppositely facing side edge portions of said end portions of said first and second peripheral edge lips and permitting said end portions to be crossingly interlocked at aligned pairs of said slots thereon.

17. The computer apparatus of claim 12 wherein:

said computer chassis and said mounting plate structure are of sheet metal constructions.

18. The computer apparatus of claim 12 wherein:

said first and second base walls have spaced apart, upwardly projecting hook portions formed thereon and configured to be lockingly received in corresponding openings formed in the printed circuit board.

19. The computer apparatus of claim 18 wherein:

said first and second base walls further have spaced apart, upwardly projecting tab portions formed thereon and configured to underlie and supportingly engage corresponding underside portions of the printed circuit board.

20. The computer apparatus of claim 12 wherein:

said computer chassis is of a generally rectangular configuration and has a corner portion on which a pair of transverse contiguous side walls of said chassis project upwardly from said inner side of said bottom wall, and said first and second base walls are disposed within said corner portion, with said first and second peripheral edge lips forming with said transverse contiguous side walls a generally rectangular transverse electromagnetic mode—shielding barrier within which the printed circuit board may be operatively disposed.

\* \* \* \* \*